(12) United States Patent
Lin et al.

(10) Patent No.: US 11,876,248 B2
(45) Date of Patent: Jan. 16, 2024

(54) BATTERY CONNECTION MODULE

(71) Applicant: MOLEX, LLC, Lisle, IL (US)

(72) Inventors: Yong Lin, Chengdu (CN); Shang-Xiu Zeng, Chengdu (CN); Kian-Heng Lim, Jurong Town (SG); Yun-Jin Li, Chengdu (CN)

(73) Assignee: Molex, LLC, Lisle, IL (US)

( * ) Notice: Subject to any disclaimer, the term of this patent is extended or adjusted under 35 U.S.C. 154(b) by 56 days.

(21) Appl. No.: 17/519,576

(22) Filed: Nov. 5, 2021

(65) Prior Publication Data

US 2022/0173482 A1 Jun. 2, 2022

(30) Foreign Application Priority Data

Dec. 2, 2020 (CN) ......................... 202011399036.3

(51) Int. Cl.
| | |
|---|---|
| *H01M 50/507* | (2021.01) |
| *H01M 50/503* | (2021.01) |
| *H01M 50/519* | (2021.01) |
| *H01M 50/209* | (2021.01) |
| *H05K 1/02* | (2006.01) |

(52) U.S. Cl.
CPC ....... *H01M 50/507* (2021.01); *H01M 50/209* (2021.01); *H01M 50/503* (2021.01); *H01M 50/519* (2021.01); *H05K 1/028* (2013.01)

(58) Field of Classification Search
CPC ............. H01M 50/507; H01M 50/519; H01M 50/209; H01M 50/503; H05K 1/028
See application file for complete search history.

(56) References Cited

U.S. PATENT DOCUMENTS

| 9,125,306 B2 | 9/2015 | Lo | |
|---|---|---|---|
| 2013/0155632 A1* | 6/2013 | Lo | H05K 1/028 |
| | | | 361/749 |
| 2019/0088918 A1* | 3/2019 | Goh et al. | H01M 50/519 |

FOREIGN PATENT DOCUMENTS

| CN | 1677767 A | 10/2005 |
|---|---|---|
| CN | 103066462 A | 4/2013 |
| CN | 103250274 A | 8/2013 |
| CN | 103582293 A | 2/2014 |
| CN | 206585118 U | 10/2017 |
| JP | 2011049158 A | 3/2011 |
| JP | 2017041347 A | 2/2017 |

(Continued)

*Primary Examiner* — Matthew T Martin
*Assistant Examiner* — Alexandra J Simmons

(57) ABSTRACT

A battery connection module is provided. The battery connection module is adapted to connect a plurality of batteries, the battery connection module includes a plurality of busbars and a single layer wiring flexible circuit board. The plurality of busbars are used to connect a plurality of batteries in series. The single layer wiring flexible circuit board has multiple connector connecting points positioned to a front end portion thereof and a multiple traces, front ends of the multiple traces are respectively connected to the multiple connector connecting points, and rear end connecting points of some of the multiple traces are electrically and mechanically connected to the plurality of busbars, the multiple traces includes at least one rounding trace and at least one rounded trace, the rounding trace rounds the rear end connecting point of the rounded trace so as to round from one side of the at least one rounded trace to the other side of the at least one rounded trace.

20 Claims, 8 Drawing Sheets

(56) References Cited

FOREIGN PATENT DOCUMENTS

| | | | |
|---|---|---|---|
| JP | 2018018612 | A | 2/2018 |
| JP | 2019057498 | A | 4/2019 |
| JP | 2020013653 | A | 1/2020 |
| JP | 2020109741 | A | 7/2020 |
| JP | 2020202060 | A | 12/2020 |
| WO | 2010090211 | A1 | 8/2010 |

* cited by examiner

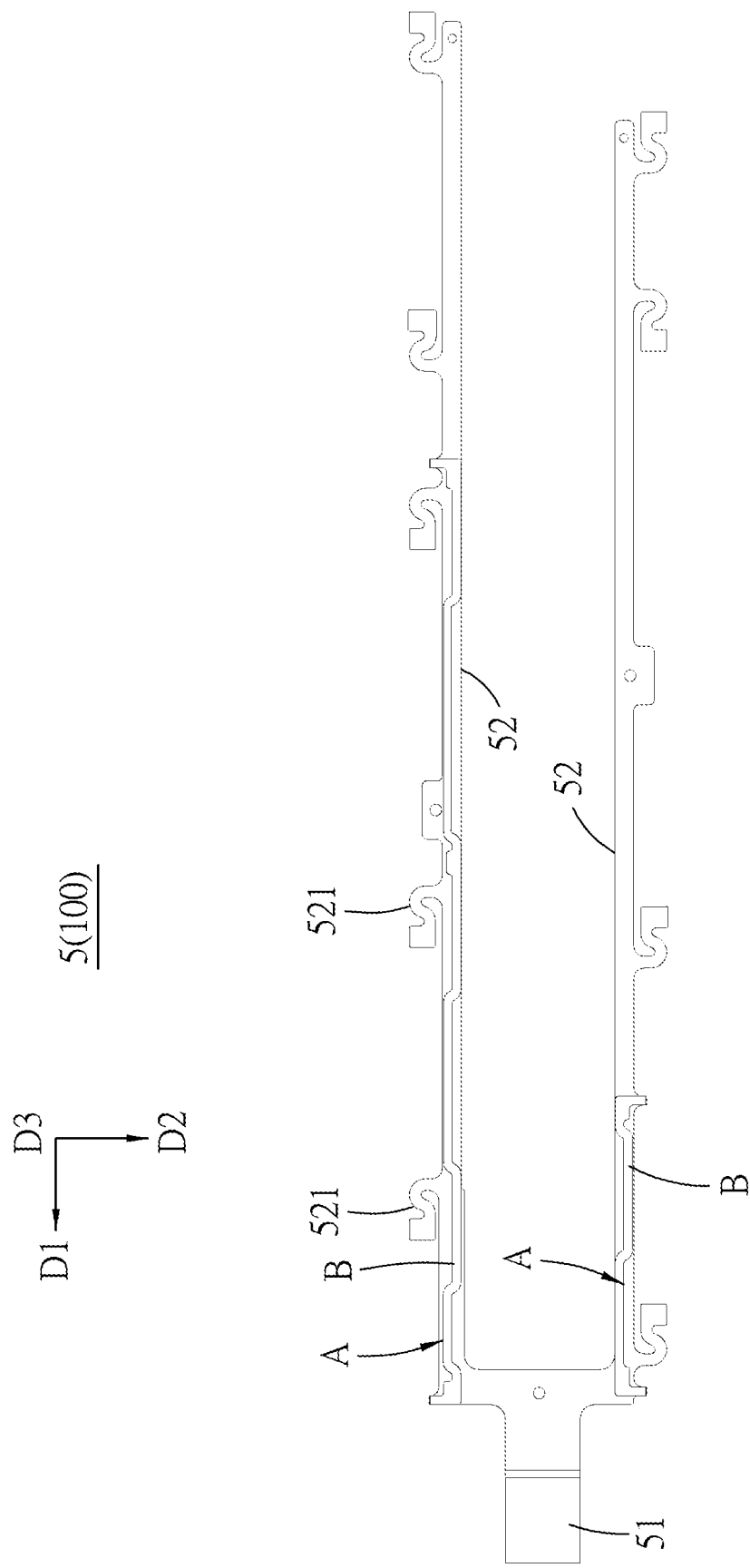

BATTERY CONNECTION MODULE

RELATED APPLICATION

This application claims priority to Chinese Application Serial No. 202011399036.3, filed on Dec. 2, 2020, which is incorporated by reference in its entirety.

TECHNICAL FIELD

The present disclosure relates to a battery connection module, and particularly relates to a battery connection module having a circuit board.

BACKGROUND ART

Chinese disclosure patent application publication No. CN103582293A disclose a method to realize straddling, in which a flexible circuit board is cut around a first welding point to separate the first welding point from the flexible circuit board, the separated the first welding point is folded onto a back face of the flexible circuit board, the first welding point on the flexible circuit board and a second welding point on a front face of the flexible circuit board are positioned at the same side of a metal coil included by the flexible circuit board. However, such a manner of cutting the flexible circuit board to make wirings intersected only can be applied to the flexible circuit board having a sufficient space which may be cut and folded, but cannot be applied to a flexible circuit board which does not have a sufficient space to be cut and is compact in wiring arrangement (for example, a wiring construction of a circuit board of a battery connection module of the present application) and, in addition, the flexible circuit board will also make a structure strength thereof significantly lowered after cut.

Chinese utility model patent application issuance publication No. CN203027596U (correspond to utility U.S. Pat. No. 9,125,306B2) discloses a flexible circuit board, the flexible circuit board includes a high-frequency signal wiring substrate and a low-frequency signal wiring substrate, side edges of high-frequency signal wiring substrate and the low-frequency signal wiring substrate are connected with each other, high-frequency signal traces are provided on the high-frequency signal wiring substrate and are correspondingly connected to two high-frequency signal connecting points on a connecting plate, low-frequency signal traces are provided on the low-frequency signal wiring substrate and are correspondingly connected to two low-frequency signal connecting points on the connecting plate. The low-frequency signal wiring substrate is folded toward the high-frequency signal wiring substrate by means of a groove and two notches. However, whether before the flexible circuit board is folded or after the flexible circuit board is folded, the high-frequency signal traces on the flexible circuit board are still parallel to and cannot be intersected with the low-frequency signal traces on the flexible circuit board.

For example, in the field of vehicle power battery, in a battery connection module connecting a plurality of batteries in a battery pack, because a flexible circuit board has a limited space, and when wiring lines are connected to connector connecting points, because an arrangement of the connector connecting points may be dense or has rows, or some of the connector connecting points are specified to connect specified wiring lines, some of the wiring lines are inevitably intersected, therefore only a flexible circuit board presently used for the battery connection module is an at least two layer flexible circuit board, can wiring intersection be realized. However, the two or more layer flexible circuit board is high in price, is large in cost burden. If a single layer flexible circuit board is used, the price is cheap much more, and cost burden may be significantly lowered. However, in the field of battery connection module, the above prior arts cannot completely solve the problem of wiring intersection on a single layer flexible circuit board which does not have a sufficient space to be cut and is compact in wiring arrangement.

SUMMARY

Therefore, an object of the present disclosure is to provide a battery connection module which can improve at least one deficiency in the prior art.

Accordingly, in some embodiments, a battery connection module of the present disclosure is adapted to connect a plurality of batteries, the battery connection module comprises a plurality of busbars and a single layer wiring flexible circuit board. The plurality of busbars are used to connect a plurality of batteries in series. The single layer wiring flexible circuit board has multiple connector connecting points positioned to a front end portion thereof and a multiple traces, front ends of the multiple traces are respectively connected to the multiple connector connecting points, and rear end connecting points of some of the multiple traces are electrically and mechanically connected to the plurality of busbars, the multiple traces comprises at least one rounding trace and at least one rounded trace, the rounding trace rounds the rear end connecting point of the rounded trace so as to round from one side of the at least one rounded trace to the other side of the at least one rounded trace.

In some embodiments, the single layer wiring flexible circuit board further has a plurality of lateral extension support arms which correspond to the plurality of busbars and are provided with the rear end connecting points of the corresponding traces respectively, the rounding trace extends onto the lateral extension support arm which corresponds to the rounded trace so as to round the rear end connecting point of the rounded trace.

In some embodiments, the rear end connecting points of the corresponding traces and the plurality of busbars are respectively connected by electrically conductive pieces, the rounding trace does not contact the electrical electrically conductive piece which is connected with the rear end connecting point of the rounded trace.

In some embodiments, the electrically conductive piece has an arching portion arching upwardly, the rounding trace passes from below the arching portion.

In some embodiments, a bridge-type extension piece is integrally constructed on the single layer wiring flexible circuit board, the bridge-type extension piece straddlingly rounds the rear end connecting point of the at least one rounded trace, the rounding trace extends to the bridge-type extension piece and rounds the rear end connecting point of the rounded trace by means of the bridge-type extension piece.

In some embodiments, at least two ends of the bridge-type extension piece are connected to the single layer wiring flexible circuit board, and the bridge-type extension piece and the single layer wiring flexible circuit board together define a hollow region, locations where the bridge-type extension piece and the single layer wiring flexible circuit board are connected can be folded so as to make the bridge-type extension piece folded and cover the single layer wiring flexible circuit board.

In some embodiments, the single layer wiring flexible circuit board further has a plurality of lateral extension support arms which correspond to the plurality of busbars and are provided with the rear end connecting points of the corresponding traces respectively, the bridge-type extension piece straddlingly rounds an outer side of the at least one lateral extension support arm which is provided with rear end connecting point of the at least one rounded trace.

In some embodiments, the single layer wiring flexible circuit board further has at least one trace which is adapted to be connected with a temperature sensor.

In some embodiments, the battery connection module further comprises a carrying tray, the single layer wiring flexible circuit board and the plurality of busbars are mounted to the carrying tray.

In the battery connection module of the present disclosure, by the wiring construction of the rounding trace and the rounded trace on the single layer wiring flexible circuit board, the problem of wiring intersection on the single layer wiring flexible circuit board which has the single wiring layer can be better solved, therefore the single layer wiring flexible circuit board can be applied in the limited space of the battery connection module, so as to significantly lower manufacturing cost.

BRIEF DESCRIPTION OF THE DRAWINGS

Other features and effects of the present disclosure will be apparent in an embodiment referring to the accompanying drawings in which:

FIG. 8 is a top schematic view of the single layer wiring flexible circuit board of the second embodiment, in which two bridge-type extension pieces are folded and covers the single layer wiring flexible circuit board, and in which traces of the single layer wiring flexible circuit board are omitted.

DETAILED DESCRIPTION OF PREFERRED EMBODIMENTS

Figure 1:
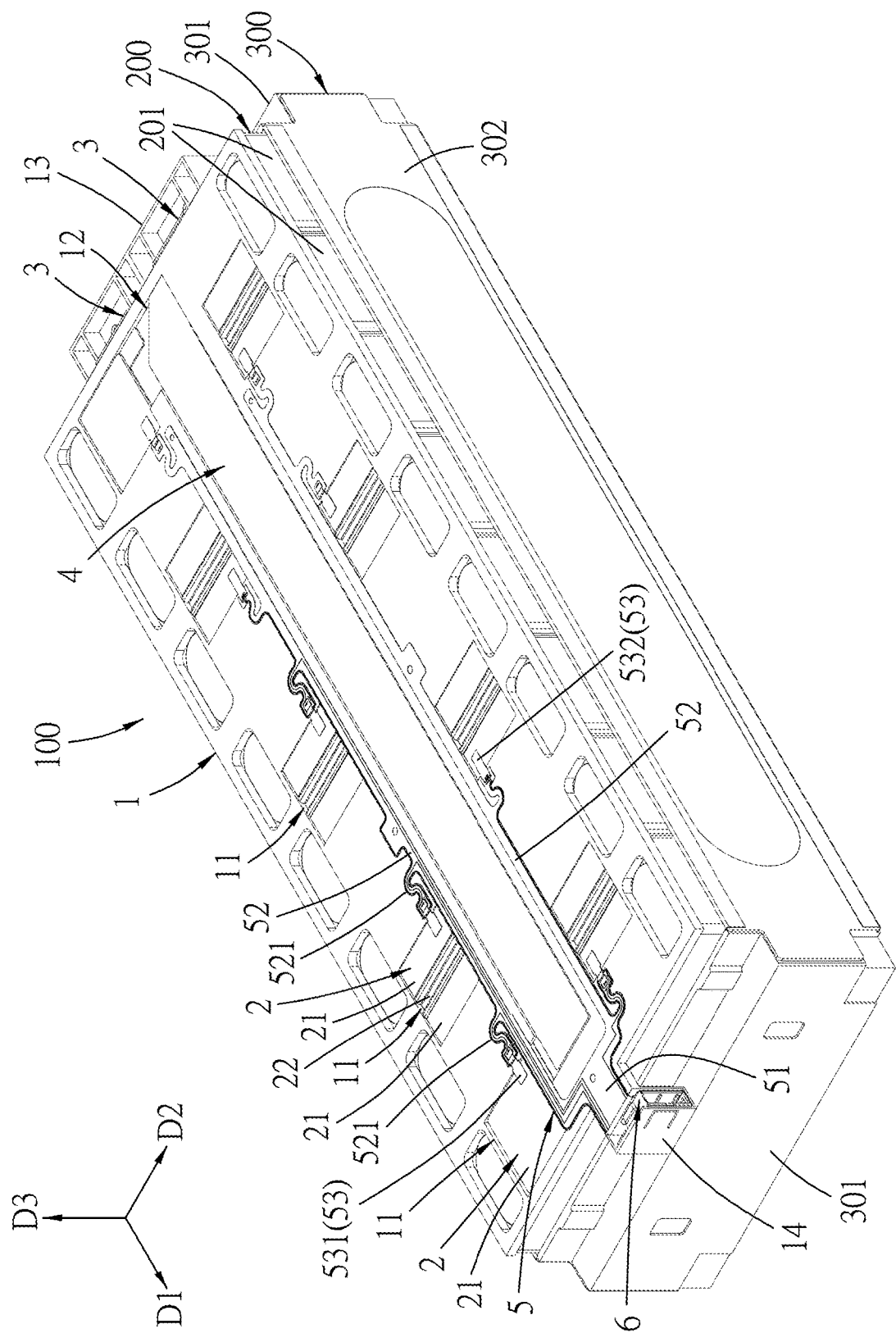
FIG. 1 is a perspective schematic view of a first embodiment of a battery connection module of the present disclosure and a battery set and a battery receiving shell.

Before the present disclosure is described in detail, it is noted that the similar components are indicated by the same reference numerals in the following description.

Figure 2:
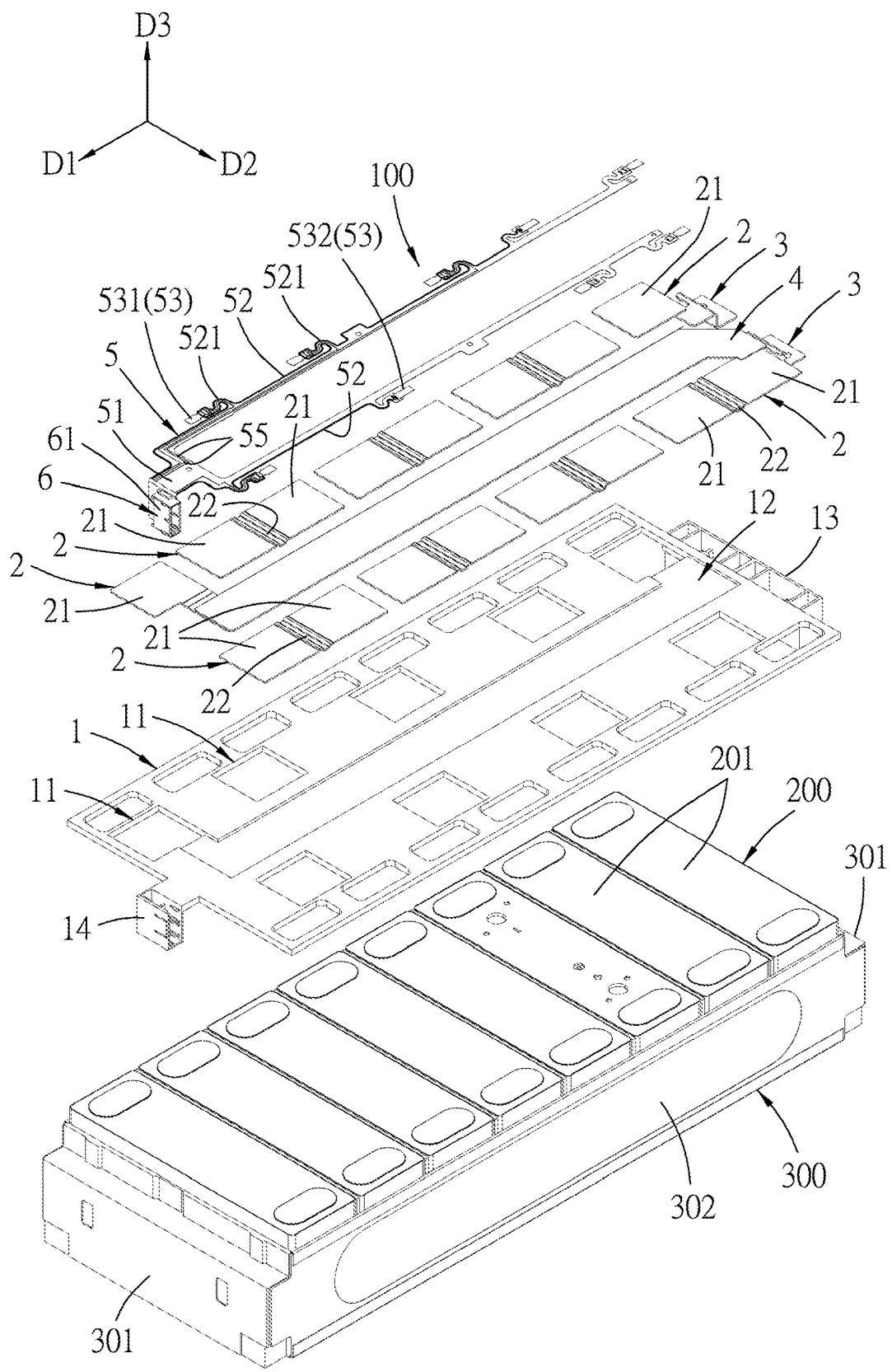
FIG. 2 is a perspective exploded schematic view of FIG. 1.

Referring to FIG. 1 and FIG. 2, a first embodiment of a battery connection module 100 of the present disclosure is adapted to be electrically connected to a battery set 200, the battery set 200 has a plurality of batteries 201, in the first embodiment, the plurality of batteries 201 are arranged as one row. The battery set 200 is received in a battery receiving shell 300, the battery receiving shell 300 has two end plates 301 which are positioned at two ends of the battery set 200 and two side plates 302 which are positioned at two sides of the battery set 200 and are connected between the two end plates 301. The battery connection module 100 includes a carrying tray 1, a plurality of busbars 2, two output connection members 3, a lapping member 4, a single layer wiring flexible circuit board 5 and a connector 6.

The carrying tray 1 extends along a front-rear direction D1 (in which an arrow pointing direction is front and an opposite direction is rear) and a left-right direction D2 (in which an arrow pointing direction is right and an opposite direction is left) and is adapted to be provided on the battery set 200 along an up-down direction D3 (in which an arrow pointing direction is up and an opposite direction is down), and is made of an insulative material. The carrying tray 1 has a plurality of busbar mounting grooves 11 which are arranged along the front-rear direction D1 and are arranged as two rows along the left-right direction D2, a lapping member mounting groove 12 which extends along the front-rear direction D1 and is positioned between the two rows of the busbar mounting grooves 11, and an output connection member receiving portion 13 and a connector box 14 which are respectively integrally formed at a rear end and a front end of the carrying tray 1 in the front-rear direction D1.

The plurality of busbars 2 are respectively mounted to the plurality of busbar mounting grooves 11 of the carrying tray 1 correspondingly and are used to connect the plurality of batteries 201 of the battery set 200 in series, the two busbars 2 of the plurality of busbars 2 respectively positioned at two in series connection end points of the whole batteries 201 only each have one battery connecting portion 21, other busbars 2 of the plurality of busbars 2 each have two battery connecting portions 21 which are arranged along the front-rear direction D1 and are adapted to be connected with electrodes of the adjacent two batteries 201 and a buffering portion 22 which is positioned between the two battery connecting portions 21, bulges downwardly and extends along the left-right direction D2. The battery connecting portion 21 may be connected with the electrode of the corresponding battery 201 by for example welding. In addition, it is noted that, in other varied implementing manners, the number of the battery connecting portion 21 also may be three or more, at this time the number of the buffering portion 22 positioned between the battery connecting portions 21 is two or more. The two output connection members 3 are provided to the output connection member receiving portion 13, the lapping member 4 is provided to the lapping member mounting groove 12, one output connection member 3 of the two output connection members 3 is lapped with one busbar 2 positioned at corresponding one in series connection end point of the whole batteries 201, the other output connection member 3 of the two output connection members 3 is lapped with the other busbar 2 positioned at the other in series connection end point of the whole batteries 201 via the lapping member 4, so that the two output connection members 3 are distributed at the same side edge of the carrying tray 1. In the present embodiment, the plurality of busbars 2 may be integrally formed with the carrying tray 1 by injection molding and embedded onto the carrying tray 1. In an embodiment, the plurality of busbars 2 may be respectively assembled to the plurality of busbar mounting grooves 11 of the carrying tray 1 by assembling manner.

Referring to FIG. 2 to FIG. 5, the single layer wiring flexible circuit board 5 (a single layer FPC) is a flexible circuit board having a single wiring layer, it is noted that, the definition of the number of the wiring layer uses a plane which may be wired as the definition of the number of the layer. For example, herein the single layer wiring flexible circuit board 5 having the single wiring layer refers to a flexible circuit board that wiring is performed on a single plane. In addition, besides the wiring layer, the single layer wiring flexible circuit board 5 may at least further have an insulative substrate which is used to provide traces to form the wiring layer and an insulative layer (not shown) which covers the traces (of the wiring layer).

The single layer wiring flexible circuit board 5 is mounted to the carrying tray 1, and the single layer wiring flexible circuit board 5 has a front end portion 51 positioned at a front end of the single layer wiring flexible circuit board 5 and two branch portions 52 which extend rearwardly from the front end portion 51, spaced apart from each other along the left-right direction D2 and are positioned adjacent to the plurality of busbars 2, each branch portion 52 has lateral extension support arms 521 which each extend curvedly and each are connected to the corresponding busbar 2 via a bridging piece 53, but a structure of the single layer wiring flexible circuit board 5 in other implementing manners is not limited to the structure of the first embodiment. The single layer wiring flexible circuit board 5 further has multiple connector connecting points 54 which are formed to and positioned to the front end portion 51 and multiple traces 55. Front ends of the multiple traces 55 are respectively connected to the multiple connector connecting points 54, and rear ends of the multiple traces 55 respectively extend toward the lateral extension support arms 521 of the two branch portions 52 and each are formed with a rear end connecting point C which is provided to the corresponding lateral extension support arm 521, the rear end connecting points C of some of the multiple traces 55 are electrically and mechanically connected to the plurality of busbars 2 respectively 2. For example, the corresponding trace 55 may be connected with the corresponding busbar 2 via the rear end connecting point C provided to the corresponding trace 55 and via the bridging piece 53, but the present disclosure is not limited thereto. Each rear end connecting point C has a front side C1 facing the front end portion 51, a rear side C2 opposite the front side C1, and inner and outer sides C3, C4 extending between the front and rear sides C1, C2. In addition, for sake of conciseness of the specification and easily understanding, here only the traces 55 on a part of the lateral extension support arms 521 are shown. It is noted that, for example, the single layer wiring flexible circuit board 5 may have at least one trace 55 which is used to be connected with a temperature sensor 56 provided to at least one lateral extension support arm 521, in the first embodiment, the single layer wiring flexible circuit board 5 has four traces 55 which are adapted to be connected with two temperature sensors 56 respectively provided to two lateral extension support arms 521, each temperature sensor 56 are connected with the rear end connecting points C of the corresponding two traces 55, and the two bridging pieces 53 corresponding to the two lateral extension support arms 521 each are provided between a part of the corresponding lateral extension support arm 521 positioned around the corresponding temperature sensor 56 and the corresponding busbar 2, but the present disclosure is not limited thereto. That is to say, the single layer wiring flexible circuit board 5 may have a trace 55 connected to the busbar 2 via the bridging piece 53 and a trace 55 connected to the temperature sensor 56 or other electronic element. Moreover, it is noted that, the bridging piece 53 connected between the rear end connecting point C of the trace 55 on the lateral extension support arm 521 and the busbar 2 for example is an electrically conductive piece 531 used to perform electrical conduction, but the bridging piece 53 connected between a part of the lateral extension support arm 521 positioned around the temperature sensor 56 and the busbar 2 for example is a thermal conductive piece 532 used to perform thermal conduction, but the present disclosure is not limited thereto, for example, the thermal conductive piece 532 also may be connected to the trace 55.

Figure 3:
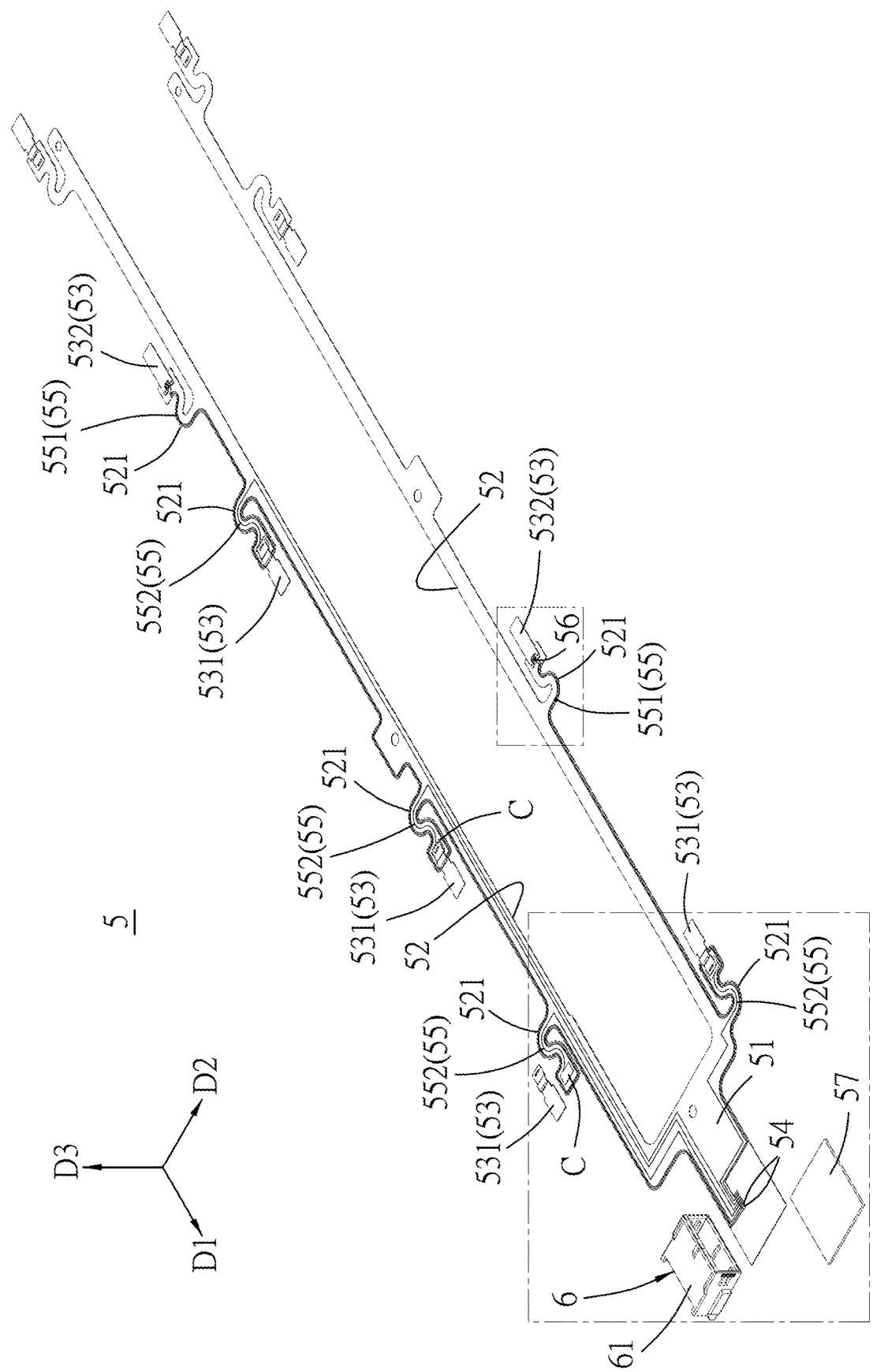
FIG. 3 is a perspective exploded schematic view of a single layer wiring flexible circuit board and a connector of the first embodiment.
Figure 4:
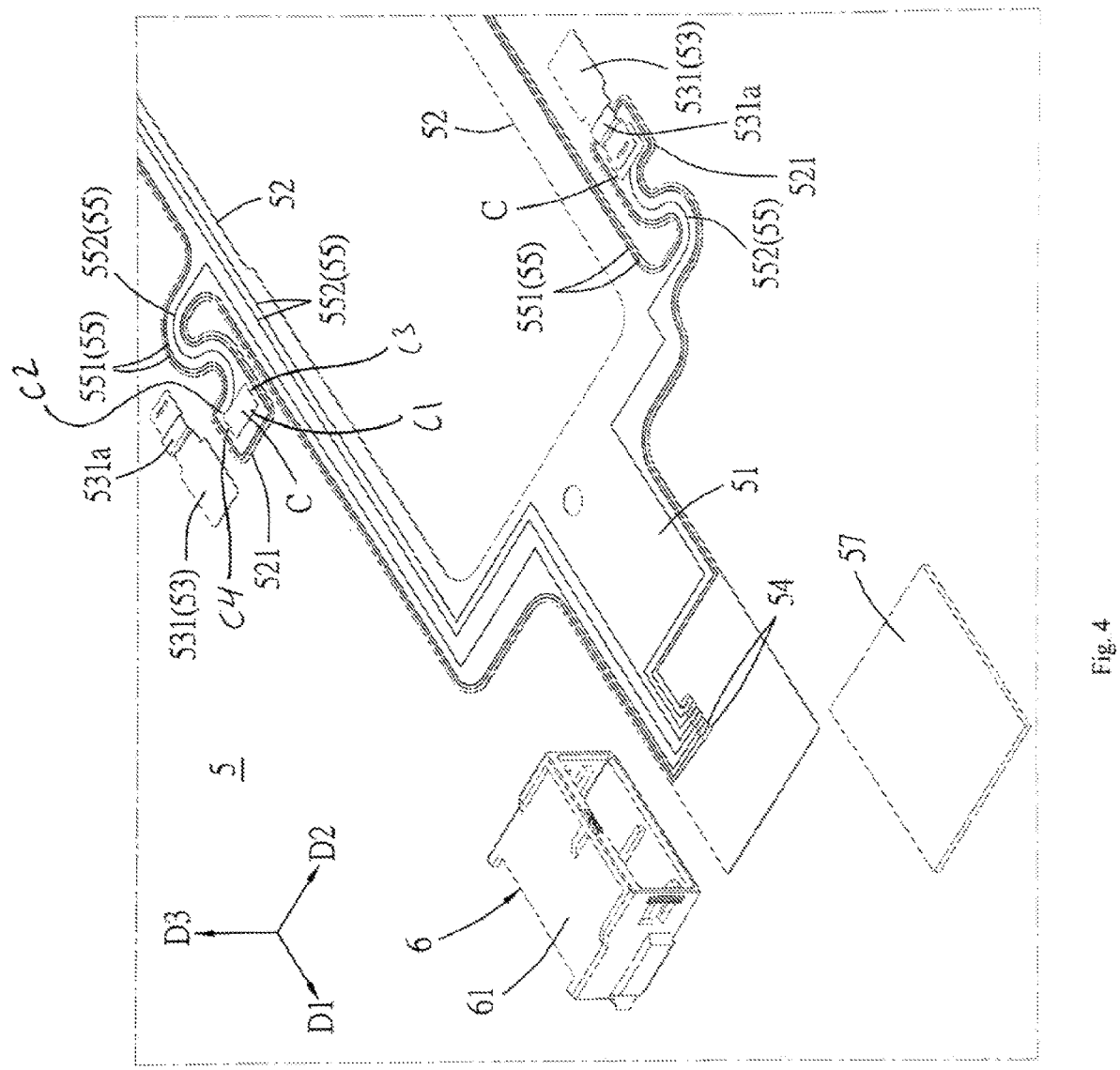
FIG. 4 is a partially enlarged perspective schematic view of FIG. 3.
Figure 5:
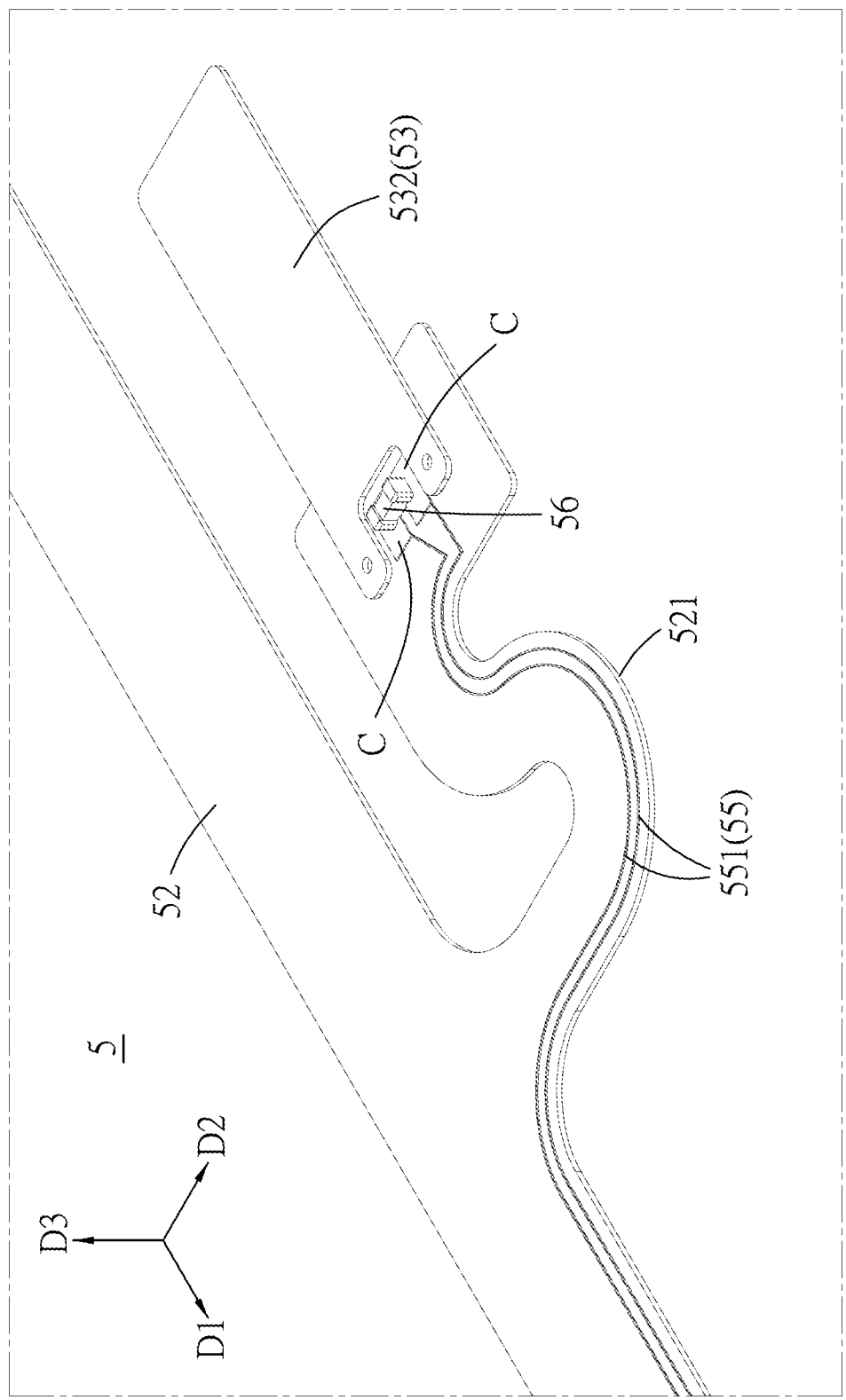
FIG. 5 is another partially enlarged perspective schematic view of FIG. 3.
Figure 6:
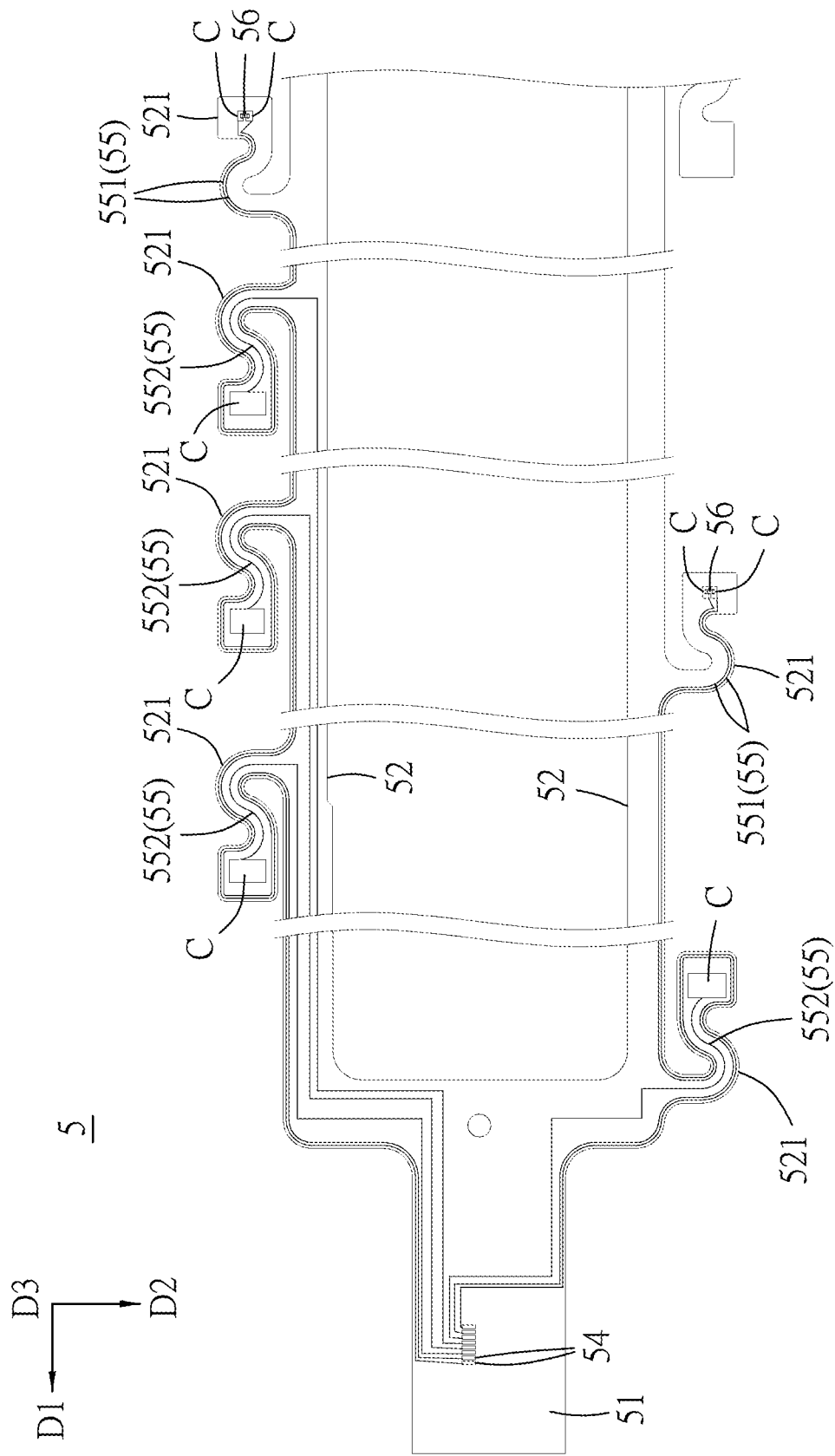
FIG. 6 is a top schematic view of the single layer wiring flexible circuit board of the first embodiment.

Referring to FIG. 3 to FIG. 6, in the first embodiment, the multiple traces 55 includes four rounding traces 551 and four rounded traces 552, the four rounding traces 551 form two groups which each are constituted by every two of the four rounding traces 551, and the two groups of the rounding traces 551 are respectively connected to the two temperature sensors 56, one group of the rounding traces 551 which is positioned on the branch portion 52 at the left side of FIG. 3 and is positioned behind corresponds to the three rounded traces 552 positioned in front, but the other group of the rounding traces 551 which is positioned on the branch portion 52 at the right side of FIG. 3 and is positioned behind corresponds to one rounded trace 552 positioned in front, but the present disclosure is not limited thereto, in addition, the rounding trace 551 and the rounded trace 552 also may be adjusted in number as desired, the rounding trace 551 and the rounded trace 552 each only need to be at least one. The rounding trace 551 positioned behind rounds the rear end connecting point C of the rounded trace 552 positioned in front so as to round from one side of the rounded trace 552 to the other side of the rounded trace 552. As shown in FIGS. 4 and 6, the upper rounding trace 551 extends from the connector connecting point 54, proximate to a side edge of the single layer wiring flexible circuit board 5, onto the lateral extension support arm 521 and completely past the inner side C3, the front side C1, the outer side C3 and the rear side C2 of the rear end connecting point C of the left most rounded trace 552, then proximate to the side edge of the single layer wiring flexible circuit board 5, and onto the middle lateral extension support arm 521 and completely past the inner side C3, the front side C1, the outer side C3 and the rear side C2 of the rear end connecting point C of the middle rounded trace 552, then again proximate to the side edge of the single layer wiring flexible circuit board 5, and onto the right most lateral extension support arm 521 and completely past the inner side C3, the front side C1, the outer side C3 and the rear side C2 of the rear end connecting point C of the right most rounded trace 552, then then proximate to the side edge of the single layer wiring flexible circuit board 5. As shown in FIGS. 4 and 6, the bottom rounding trace 551 extends from the connector connecting point 54 proximate to the opposite side edge of the single layer wiring flexible circuit board 5, and onto the bottom lateral extension support arm 521 and completely past the front side C1, the outer side C3, the rear side C2 and the inner side C4 of the rear end connecting point C of the bottom rounded trace 552. Specifically, the branch portion 52 positioned at the left side of FIG. 3 and FIG. 6 is taken for explanation, the group of the rounding traces 551 extends onto the three lateral extension support arms 521 corresponding to the three rounded traces 552, runs along edges of the three lateral extension support arms 521 to round the three rear end connecting points C of the three rounded traces 552, and finally extends to the lateral extension support arm 521 which corresponds to the group of the rounding traces 551 and relatively positioned at the rear side, and the group of the rounding traces 551 rounds from a position at an inner side of the respective rounded trace 552 close to the front end portion 51 to a position at an outer side of the respective rounded trace 552 away from the front end portion 51 on the lateral extension support arms 521 corresponding to the three rounded traces 552. The branch portion 52 positioned at the right side of FIG. 3 and FIG. 6 is taken for explanation, the group of the rounding traces 551 extends to the one lateral extension support arm 521 corresponding to the one rounded trace 552, runs along an edge of the one lateral extension support arm 521 to round one rear end connecting point C of the one rounded trace 552, and finally extends to the lateral extension support arm 521 which corresponds to the group of the rounding traces 551 and is relatively positioned at the rear side, and the group of the rounding traces 551 rounds from a position at an outer side of the one rounded trace 552 away from the front end portion 51 to a position at an inner side of the one rounded trace 552 adjacent to the front end portion 51 on the lateral extension support arm 521 corresponding to the one rounded trace 552. Moreover, the two groups of the rounding traces 551 does not contact the electrically conductive pieces 531 which are respectively connected with the rear end connecting points C of the four rounded traces 552, in the first embodiment, each electrically conductive piece 531 has an arching portion 531a arching upwardly, the rounding trace 551 passes from below the arching portion 531a, thereby avoiding occurrence of short circuit.

Referring to FIG. 1 to FIG. 4, the connector 6 is provided to the single layer wiring flexible circuit board 5 and is connected with the multiple connector connecting points 54 on the front end portion 51, the single layer wiring flexible circuit board 5 is further provided with a strengthening back plate 57 at a position of the single layer wiring flexible circuit board 5 corresponding to the connector 6. The connector 6, a part of the front end portion 51 of the single layer wiring flexible circuit board 5 and the strengthening back plate 57 together are downwardly received in the connector box 14 of the carrying tray 1. The connector 6 has a housing 61 and multiple terminals (not shown) provided to the housing 61 and connected with the multiple connector connecting points 54. It is noted that, status information (for example, temperatures, voltages and the like) of the batteries 201 of the battery set 200 can be collected by the single layer wiring flexible circuit board 5, and the status information can be transmitted by the connector 6 provided on the single layer wiring flexible circuit board 5 to a battery management device (not shown) mated with the connector 6.

Figure 7:
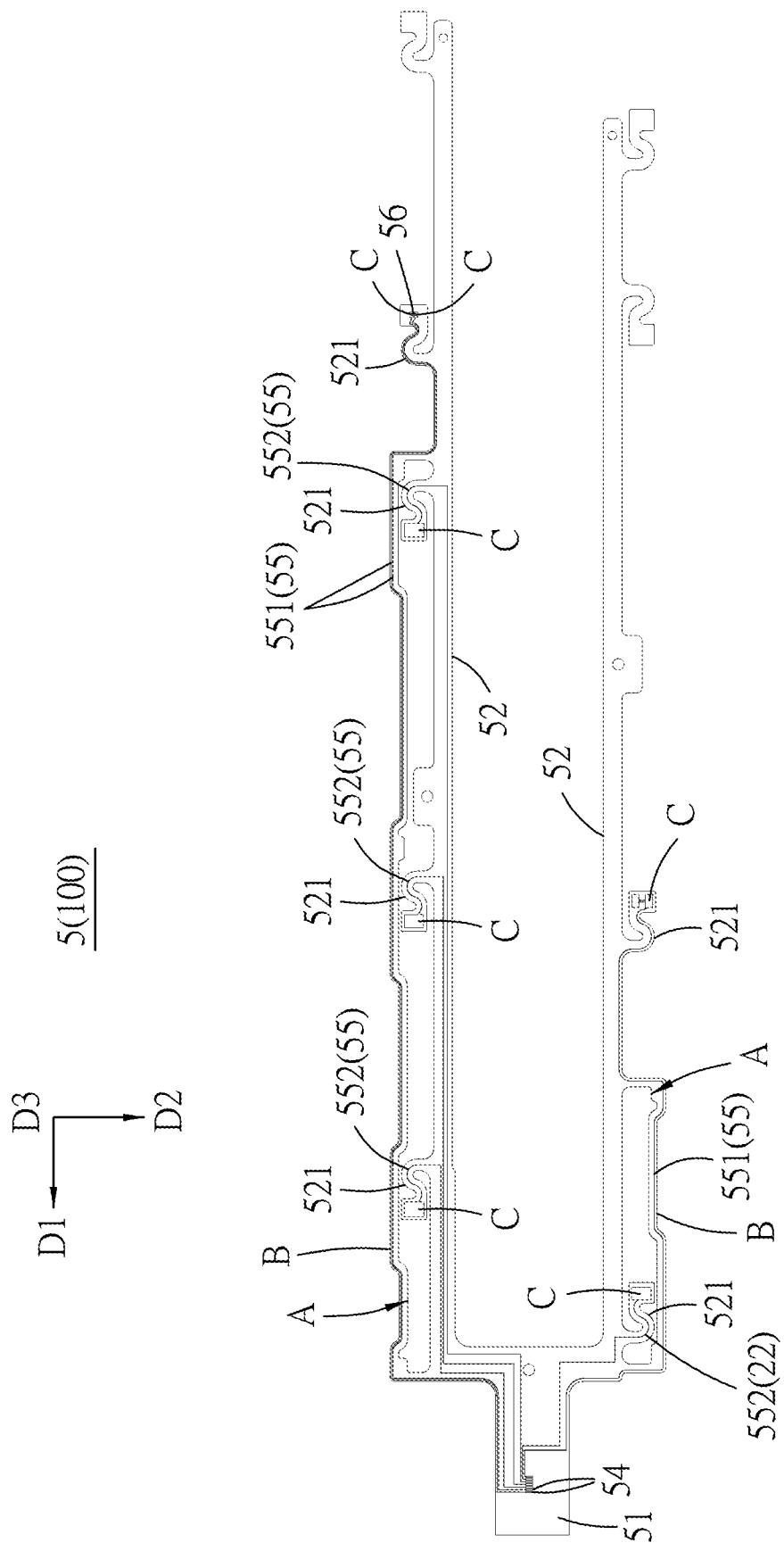
FIG. 7 is a top schematic view of a single layer wiring flexible circuit board of a second embodiment of the battery connection module of the present disclosure.

Referring to FIG. 7 to FIG. 8, a second embodiment of the battery connection module 100 of the present disclosure differs from the first embodiment in that, two bridge-type extension pieces B are further integrally constructed on the single layer wiring flexible circuit board 5 to respectively correspond to the two groups of the rounding traces 551, for example, the two bridge-type extension pieces B are respectively integrally formed to outer sides of the two branch portions 52, and two ends of each bridge-type extension piece B are connected to the corresponding branch portion 52 of the single layer wiring flexible circuit board 5, the bridge-type extension piece B and the corresponding branch portion 52 of the single layer wiring flexible circuit board 5 together define a hollow region A, locations where the two bridge-type extension piece B and the branch portions 52 of the single layer wiring flexible circuit board 5 are connected can be folded, so as to make the two bridge-type extension piece B folded and cover the single layer wiring flexible circuit board 5. The two bridge-type extension pieces B respectively straddlingly round the rear end connecting points C of the rounded traces 552 and the outer sides of the lateral extension support arms 521 corresponding to the rounded traces 552. The two groups of the rounding traces 551 respectively extend to the two bridge-type extension pieces B, and round the rear end connecting points C of the rounded traces 552 by means of the two bridge-type extension pieces B so as to round from one side of the rounded traces 552 to the other side of the rounded traces 552. As shown in FIG. 7, the upper rounding trace 551 extends from the connector connecting point 54, proximate to a side edge of the single layer wiring flexible circuit board 5, onto and along the bridge-type extension piece B and completely past the front sides C1, the outer sides C4 and the rear sides C2 of the rear end connecting points C of the rounded traces 552, then again along the side edge of the single layer wiring flexible circuit board 5. As shown in FIG. 7, the bottom rounding trace 551 extends from the connector connecting point 54, along an opposite side edge of the single layer wiring flexible circuit board 5, onto and along the bridge-type extension piece B and completely past the front side C1, the outer side C4 and the rear side C2 of the rear end connecting point C of the bottom rounded trace 552.

In conclusion, by the wiring construction of the rounding trace 551 and the rounded trace 552 on the single layer wiring flexible circuit board 5 (a single layer FPC), the battery connection module 100 of the present disclosure can make the rounding trace 551 round from one side of the rounded trace 552 to the other side of the rounded trace 552, so that the problem of wiring intersection on the single layer wiring flexible circuit board 5 which has the single wiring layer can be better solved, therefore the single layer wiring flexible circuit board 5 which has relatively lower cost can be applied in the limited space of the battery connection module 100, so as to significantly lower manufacturing cost.

However, the above description is only for the embodiments of the present disclosure and it is not intended to limit the implementing scope of the present disclosure, and the simple equivalent changes and modifications made according to the claims and the contents of the specification are still included in the scope of the present disclosure.

What is claimed is:

1. A battery connection module adapted to connect a plurality of batteries, the battery connection module comprising:
   a plurality of busbars used to connect a plurality of batteries in series; and
   a single layer wiring flexible circuit board having multiple front end connector connecting points positioned at a front end portion thereof, first and second rounded traces, and first and second rounding traces,
      a front end of each rounded trace being respectively connected to one of the front end connector connecting points, each rounded trace having a rear end connecting point electrically and mechanically connected to a respective one of the busbars, each rear end connecting point having a front side facing the front end portion, a rear side opposite the front side, and inner and outer sides extending between the front and rear sides,
      a front end of each rounding trace being connected to other ones of the front end connector connecting points, the first trace extending completely past at least three of the sides of the rear end connecting point of the first rounded trace, and the second rounding trace extending completely past at least three of the sides of the rear end connecting point of the second rounded trace.

2. The battery connection module of claim 1, wherein the single layer wiring flexible circuit board further has a lateral extension support arm integrally constructed thereon, wherein the rear end connecting point of the first rounded trace is provided on the lateral extension support arm, the first rounding trace extends onto the lateral extension support arm so as to extend completely past the least three of the sides of the rear end connecting point of the first rounded trace.

3. The battery connection module of claim 2, wherein the rear end connecting points of the corresponding rounded traces and the plurality of busbars are respectively connected by electrically conductive pieces, wherein the respective rounding trace does not contact the respective electrically conductive piece.

4. The battery connection module of claim 3, wherein each electrically conductive piece has an arching portion arching upwardly, the respective rounding trace passes below the respective arching portion.

5. The battery connection module of claim 1, wherein a bridge-type extension piece is integrally constructed on the single layer wiring flexible circuit board and has two ends thereof connected to the single layer wiring flexible circuit board to form a hollow region in which the rear end connecting point of the first rounded trace is provided, the first rounding trace extending along the bridge-type extension piece to extend completely past the at least three of the sides of the rear end connecting point of the first rounded trace.

6. The battery connection module of claim 5, wherein the bridge-type extension piece is folded at the two ends to cover the single layer wiring flexible circuit board.

7. The battery connection module of claim 6, wherein the single layer wiring flexible circuit board further has lateral extension support arm integrally constructed thereon, wherein the rear end connecting point of the first rounded trace is provided on the lateral extension support arm.

8. The battery connection module of claim 1, wherein at least one of the rounding traces is coupled to a temperature sensor.

9. The battery connection module of claim 1, wherein the battery connection module further comprises a carrying tray on which the single layer wiring flexible circuit board and the plurality of busbars are mounted.

10. The battery connection module of claim 2, wherein the lateral extension support arm extends outward from a linear edge of the single layer wiring flexible circuit board.

11. The battery connection module of claim 1, wherein a third rounded trace has a front end connected to a third one of the front end connector connecting points, the third rounded trace having a third rear end connecting point electrically and mechanically connected to a third one of the busbars, the third rear end connecting point having a front side facing the front end portion, a rear side opposite the front side, and inner and outer sides extending between the front and rear sides, wherein the first rounding trace further extends completely past at least three of the sides of the third rear end connecting point of the first rounded trace.

12. The battery connection module of claim 11, wherein the single layer wiring flexible circuit board further has a second lateral extension support arm, wherein the third rear end connecting point is provided on the second lateral extension support arm, the first rounding trace further extends onto the second lateral extension support arm so as to extend completely past the least three of the sides of the third rear end connecting point of the third rounded trace.

13. The battery connection module of claim 12, wherein the third rear end connecting point of the third rounded trace and the third busbar are connected by a third electrically conductive piece, wherein the first rounding trace does not contact the third electrically conductive piece.

14. The battery connection module of claim 13, wherein the third electrically conductive piece has a third arching portion arching upwardly, the first rounding trace passes below the third arching portion.

15. The battery connection module of claim 11, wherein a bridge-type extension piece is integrally constructed on the single layer wiring flexible circuit board and has two ends thereof connected to the single layer wiring flexible circuit board to form a hollow region in which the rear end connecting points of the first and third rounded traces are provided, the first rounding trace extending along the bridge-type extension piece to extend completely past the at least three of the sides of the rear end connecting points of the first and third rounded traces.

16. The battery connection module of claim 15, wherein the bridge-type extension piece is folded at the two ends to cover the single layer wiring flexible circuit board.

17. The battery connection module of claim 16, wherein the single layer wiring flexible circuit board further has first and second lateral extension support arms integrally constructed thereon, wherein the rear end connecting point is provided on the first lateral extension support arm and the third rear end connecting point is provided on the second lateral extension support arm.

18. The battery connection module of claim 17, wherein the first and second lateral extension support arms extend outward from an edge of the single layer wiring flexible circuit board.

19. The battery connection module of claim 17, wherein the first lateral extension support arm extend outward from a first edge of the single layer wiring flexible circuit board, and the second lateral extension support arm extends outward from a second different edge of the single layer wiring flexible circuit board.

20. The battery connection module of claim 11, wherein the battery connection module further comprises a carrying tray on which the single layer wiring flexible circuit board and the plurality of busbars are mounted.

* * * * *